(12) United States Patent     (10) Patent No.:   US 12,580,603 B2

Patel et al.     (45) Date of Patent:    Mar. 17, 2026

(54) THERMAL MANAGEMENT OF RADIO-FREQUENCY FILTERS IN A WIRELESS NETWORKING DEVICE

(71) Applicant: HEWLETT PACKARD ENTERPRISE DEVELOPMENT LP, Spring, TX (US)

(72) Inventors: Deven Patel, Santa Clara, CA (US); Farhan Hasnain, Santa Clara, CA (US); Gihoon Go, San Jose, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 384 days.

(21) Appl. No.: 18/468,195

(22) Filed: Sep. 15, 2023

(65) Prior Publication Data

US 2025/0096835 A1     Mar. 20, 2025

(51) Int. Cl.
    *H04B 1/036*     (2006.01)
    *H04B 1/40*     (2015.01)
    *H05K 7/20*     (2006.01)

(52) U.S. Cl.
    CPC .............. *H04B 1/40* (2013.01); *H04B 1/036* (2013.01); *H05K 7/2039* (2013.01)

(58) Field of Classification Search
    CPC . H04B 1/40; H04B 1/036; H04B 1/04; H04B 1/16; H04M 1/02; H05K 7/2039
    See application file for complete search history.

(56) References Cited

U.S. PATENT DOCUMENTS

| | | | |
|---|---|---|---|
| 7,113,399 B2 * | 9/2006 | Hisano ............... | H05K 7/20254 361/688 |
| 10,568,149 B2 * | 2/2020 | Youtz .................... | H04W 76/30 |
| 11,784,109 B2 * | 10/2023 | Ganti .................... | B06B 1/0622 62/3.1 |
| 12,289,657 B2 * | 4/2025 | Shuman .................. | H04W 4/40 |
| 2002/0151331 A1 * | 10/2002 | Abdelmonem .......... | H04B 1/18 455/561 |
| 2017/0188310 A1 * | 6/2017 | Kocagoez ............... | G06F 1/206 |
| 2017/0242463 A1 * | 8/2017 | Matteson ............... | G05B 15/02 |

(Continued)

OTHER PUBLICATIONS

Larry, Miller, "RF Filter Technologies for Dummies", 2015, 28 pages.

*Primary Examiner* — Andrew Wendell

(74) *Attorney, Agent, or Firm* — Hewlett Packard Enterprise

(57) ABSTRACT

An example cooling system for a wireless networking device is presented. The cooling system includes a Peltier cooler disposed in thermal contact with a radio-frequency (RF) filter coupled to a transceiver disposed in the wireless networking device. Further, the cooling system includes a thermal management controller coupled to the Peltier cooler and the transceiver. The thermal management controller is configured to receive a signal indicating whether the transceiver is performing a data communication. In response to determining that the transceiver is performing the data communication, the thermal management controller operates the Peltier cooler to actively cool the RF filter. However, in response to determining that the transceiver is not performing the data communication while the wireless networking device is powered on, the thermal management controller operates the Peltier cooler to stop actively cooling the RF filter.

20 Claims, 5 Drawing Sheets

(56) References Cited

U.S. PATENT DOCUMENTS

| | | | |
|---|---|---|---|
| 2019/0339750 A1* | 11/2019 | Siddiqui | G06F 1/203 |
| 2019/0383528 A1* | 12/2019 | Sung | F25B 21/02 |
| 2024/0178867 A1* | 5/2024 | Chen | H05K 7/20336 |
| 2024/0237266 A1* | 7/2024 | Rathinasamy | H05K 7/20727 |
| 2024/0314934 A1* | 9/2024 | Refai-Ahmed | H05K 5/0026 |
| 2025/0089204 A1* | 3/2025 | Forth | G06F 3/167 |

* cited by examiner

THERMAL MANAGEMENT OF RADIO-FREQUENCY FILTERS IN A WIRELESS NETWORKING DEVICE

BACKGROUND

Wireless networking devices use frequency filters for the transmission and reception of signals within a specific frequency range. In particular, in Wireless Local Area Network (WLAN) technology, due to the use of multiple frequency bands such as the 2.4 GHz Wireless-Fidelity (Wi-Fi band), 5 GHz Wi-Fi band, and the 6 GHz Wi-Fi band, there is a growing need for radio frequency (RF) filtering, mainly to separate the channels that operate in adjacent bands. In order to avoid inter-channel interference and to increase channel bandwidth utilization, RF filters having passbands with sharp transition bands are a necessity. While these RF filters may not generate much heat during the operation, the heat generated by adjacent electronic components (e.g., power amplifiers used in transceivers) may cause the RF filter to heat up which may in turn impact the performance of the RF filter.

BRIEF DESCRIPTION OF THE DRAWINGS

One or more examples in the present disclosure are described in detail with reference to the following Figures. The Figures are provided for purposes of illustration only and merely depict examples.

Figure 1:
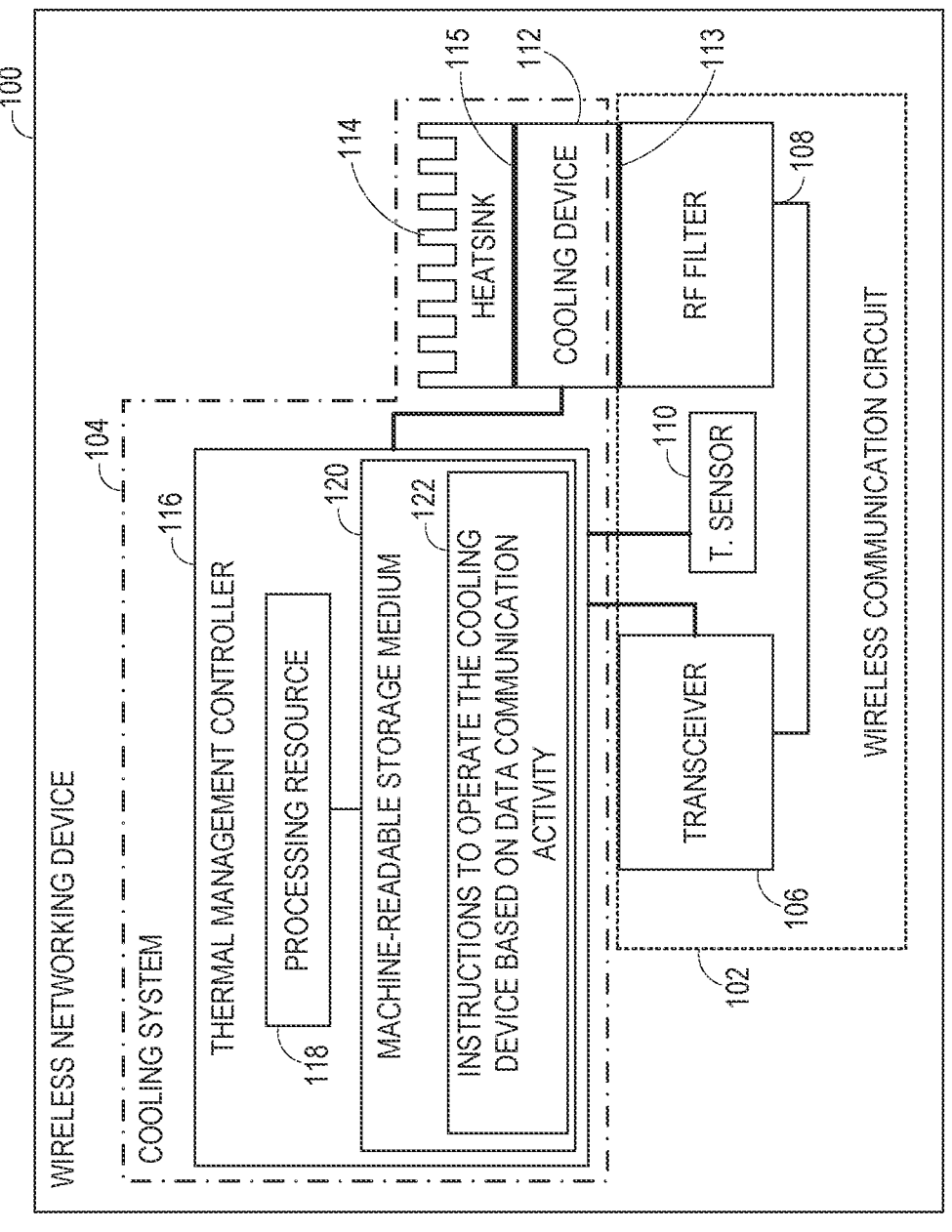
FIG. 1 depicts a block diagram of a wireless networking device in which various of the examples presented herein may be implemented.

The Figures are not exhaustive and do not limit the present disclosure to the precise form disclosed.

DETAILED DESCRIPTION

Despite the great potential that the 6 GHz band offers for increasing channel availability and throughput for Wi-Fi communications, Wi-Fi channel allocation in the 6 GHz band may create co-existence issues with existing 5 GHz Wi-Fi channels. For instance, when a wireless networking device (e.g., an access point or a router) simultaneously operates both a 5 GHz radio using the 5 GHz U-NII channel allocation and a 6 GHz radio using the proposed U-NII 6 GHz channel allocation, jamming and interference may occur for certain Wi-Fi channels within the 5 GHz and 6 GHz bands. Specifically, when the wireless networking device receives a signal in a Wi-Fi channel at or near an upper bound of the 5 GHz band while generating another signal in a Wi-Fi channel at or near a lower bound of the 6 GHz band (or when the wireless networking device receives a signal in a Wi-Fi channel at or near a lower bound of the 6 GHz band while generating another signal in a Wi-Fi channel at or near an upper bound of the 5 GHz band), the received signal may experience jamming and interference from the generated signal, thereby resulting in de-sensitization (e.g., shorter coverage range) and signal quality degradation (e.g., lower throughput) of the received signal.

With the upcoming IEEE Wi-Fi 7 802.11be Standard, key features such as Multi-Link Operation may present some new opportunities to dynamically utilize Access Points radios flexibly to offer such channels amenable to deliver higher throughput and low latency. In some implementations, to deliver such higher throughput and low latency, access point radios have been re-designed with available Wi-Fi bands. For example, in certain known implementations, access points are designed to operate multiple radios in a single band. For example, in a penta-band operation, one radio may be dedicated to the 2.4 GHz band and two radios may be dedicated to each of the 5 GHz and 6 GHz bands. Such a multi-band-multi-radio operation may not only create co-existence issues between the 5 GHz Wi-Fi channels and the 6 GHz Wi-Fi channels but also among the Wi-Fi channels within each of the 5 GHz and 6 GHz bands.

With ever-increasing frequency selectivity requirements on a wireless networking device operating simultaneously across multiple closely spaced bands, RF filter technology is being used to enable such applications. In particular, to separate communications over different channels, wireless networking devices generally implement RF filters. Typically, RF filters such as Bulk Acoustic Wave (BAW) Filters are well suited to cater to such needs with good performance at low cost.

The BAW filters may be designed to selectively filter any frequency range from hundreds of MHz to 2.5 GHZ. With the inclusion of the 6 GHz frequency band in the Wi-Fi spectrum, BAW filter technology has gained commercial interest to be scaled up to operate at frequencies from 5 GHz to 7 GHz providing higher Quality factor (Q-factor), sharpness (e.g., of values greater than 3000), and ability to filter incredibly narrow frequency spans which separate 5 GHz Wi-Fi band from the 6 GHz Wi-Fi band compared to other conventional ceramic filters. The conventional ceramic filters are limited by their Q factor (e.g., achieving the Q-factor of less than 1000) to provide the level of rejection needed, thereby creating a transition band of greater than 200 MHz. With BAW filters, such transition bands can be less than 80 MHz wide.

BAW filter technology also has some drawbacks, and one of those is its temperature stability. BAW filters use Micro Electrical Mechanical Systems (MEMS) oscillators based on silicon resonators—the operation of which may be sensitive to temperature variations. In some cases, a certain magnitude of temperature variations may de-tune a finely tuned resonator thereby negatively impacting the electrical filtering characteristics of the BAW filter. Generally, BAW filters operate inside of a product (e.g., an access point) that includes several electronic components that generate heat in addition to adjacent and ambient thermal changes. For example, in wireless networking devices such as the access points, localized temperature changes may vary significantly due to changes in the ambient temperature and due to the operation of the transceivers and processing units. For example, electronic components such as power amplifiers may have an extremely variable temperature profile depending on the efficiency, rate, and duty cycle at which they operate. While the BAW filters may generate minimal to no heat during the operation, heat generated by the power amplifiers or other electronic components may couple into the adjacent BAW filters through conduction via a shared printed circuit board or through convection (aggregate heat buildup on the surrounding enclosure, and air temperature inside the wireless networking device). Such heat coupling may increase the temperature thereof. The increase in the temperature of the BAW filters beyond a certain limit may negatively impact the filtering capability of the BAW filters, causing the wireless networking device to operate unreliably.

Some known techniques for addressing this issue may entail designing the BAW filters with a certain additional margin in their specification, thereby maintaining appropriate system-level requirements over the whole intended temperature operating range. Such margin may come at the cost of either relaxing specifications, limiting temperature or power operating range, or accepting limited filtering performance of the BAW filters, which may, in some cases, lead to inconsistent operation at the system level.

To compensate for such adverse effects of the temperature fluctuations on the performance of RF filtering, a wireless networking device (e.g., AP), in examples consistent with the teachings of this disclosure, is designed to implement an active cooling for RF filters and selective control of the active cooling. In particular, the wireless networking device may include a wireless communication circuit comprising a transceiver and an RF filter (e.g., a BAW filter) coupled to the transceiver. Further, the wireless networking device may include a cooling system coupled to the wireless communication circuit to cool the RF filter. The cooling system includes a cooling device (e.g., a Peltier cooler) disposed in thermal contact with the RF filter and a thermal management controller coupled to the cooling device and the transceiver. The cooling device may actively cool the RF filter. The term "active cooling" or "actively cool" may refer to a heat exchange arrangement that cools a target device (e.g., the RF filter in this case) using electricity. During operation, the active cooling of the RF filter by the proposed cooling device may provide relative temperature stability to the RF filter. Accordingly, the RF filter does not have to be compromised on design specification to build in margin for a wider operating temperature range and manufacturing yields, thereby allowing the wireless networking device to run at increased peak performance over a wider operating range.

Generally, the electronic components (e.g., power amplifiers) in the transceiver are observed to generate a higher amount of heat when the wireless networking device performs data communication compared to durations when no data communication is performed (for example, when the transceiver is idle). Therefore, in examples consistent with the teachings of this disclosure, the thermal management controller is configured to selectively operate the cooling device for the durations when the data communication is taking place. To enable this, the thermal management controller is configured to receive a signal indicating whether the transceiver is performing data communication. Based on the signal, the thermal management controller determines whether the transceiver is performing the data communication activity. Accordingly, the thermal management controller operates the cooling device if it determines the need to actively cool the RF filter during the period when the transceiver is performing the data communication activity. On the other hand, in response to determining that the wireless networking device is powered on, but the transceiver is not performing the data communication activity, the thermal management controller may deactivate the cooling device.

As will be appreciated, such a selective operation of the cooling device reduces the energy required to operate the cooling device. Also, any type of cooling devices such as low-cost Peltier coolers may generate additional heat due to their inherent efficiencies during their operation to the overall system. In such implementations, the proposed selective control of the Peltier coolers may transfer the amount of heat coupled into the RF filters away from the RF filters, while minimizing overall heat added to the system, thereby improving the performance of the RF filter.

The following detailed description refers to the accompanying drawings. It is to be expressly understood that the drawings are for the purpose of illustration and description only. While several examples are described in this document, modifications, adaptations, and other implementations are possible. Accordingly, the following detailed description does not limit disclosed examples. Instead, the proper scope of the disclosed examples may be defined by the appended claims, a system 100 in which various of the examples presented herein may be implemented.

Referring now to the drawings, FIG. 1 depicts a block diagram of an example wireless networking device 100 in which various of the examples presented herein may be implemented. The wireless networking device 100 may be deployed in the wireless local area networks (WLANs) to provide Wi-Fi connectivity to client devices. For example, the wireless networking device 100 may engage in any network data transmission operations, including, but not limited to, switching, routing, bridging, or a combination thereof. In some examples, the wireless networking device 100 may provide wireless connectivity to the client devices (not shown) using wireless communication techniques specified in one or more of the Institute of Electrical and Electronics Engineers (IEEE) 802.11 Standard Specifications, for example.

In an example implementation, the wireless networking device 100 may include a wireless access point commonly referred to as an access point (AP). The AP may be an electronic device that is adapted to allow wireless devices to connect to a wired network via various communications standards. An AP may include any hardware components useful to perform the inventions disclosed herein, including, but not limited to processors, memories, display devices, input devices, communications equipment, etc. It will be understood by one of ordinary skill in the art that wireless networking device 100 may be any suitable type(s) of wireless networking device that enables wireless connectivity between two or more wireless capable devices (e.g., client devices connecting to the AP).

Amongst other circuits and electronic components (not shown), the wireless networking device 100, in some examples, may include a wireless communication circuit 102 and a cooling system 104 to cool one or more components of the wireless communication circuit 102. In particular, the wireless communication circuit 102 includes electronics to enable data communication via the wireless networking device 100. The wireless communication circuit 102 may form a part of one or more radio circuits (not shown) implemented in the wireless networking device 100. The radio circuits may include electronic circuits useful to process the signals that are received and/or transmitted via the wireless networking device 100. Each of the radio circuits may operate one or more channels in one or more frequency bands (e.g., the 2.4 GHz Wi-Fi band, the 5 GHz Wi-Fi band, or the 6 GHz Wi-Fi band) that conform to one or more IEEE standards. In some other examples, the radio circuits may also include hardware suitable to function in compliance with other wireless communication techniques, for example, cellular communication protocols. It will be understood by one skilled in the art that wireless networking device 100 may comprise any suitable number of radio circuits to operate one or more wireless communication channels. In some example implementations, a radio circuit may be dedicated to each of the 2.4 GHz Wi-Fi band, the 5 GHz Wi-Fi band, the 6 GHz Wi-Fi band, or any sub-bands within any of the 2.4 GHz Wi-Fi band, the 5 GHz Wi-Fi band, the 6 GHz Wi-Fi band. In an example implementation, one or more of the radio circuits may include the wireless communication circuit 102.

The wireless communication circuit 102 may include a transceiver 106, a radio frequency (RF) filter 108, and a temperature sensor 110. The transceiver 106 may include electronic circuits to transmit and/or receive data in compliance with any wireless communication techniques, including but limited to, those described in one or more IEEE standards or cellular communication protocols, for example. Some example electronic circuits that are implemented in the wireless communication circuit 102 may include power amplifiers, low noise amplifiers (LNA), modulators, demodulators, phase shifters, signal comparators, signal conditioning circuits, etc. In some examples, the wireless communication circuit 102 may also include one or more antennas (not shown) connected to the electronic circuits to enable transmission and reception of the data.

The RF filter 108 is connected to the transceiver 106 to allow transmission and reception of signals having specific frequencies or having frequencies within a specific frequency range via the transceiver 106. In some examples, the RF filter 108 may be designed with a predefined passband to allow the specific signals to pass via the RF filter 108, thereby providing isolation between the operating channels of the wireless networking device 100. In the examples described herein, a "passband" of a given RF filter refers to a range of frequencies that the given RF filter allows passing (e.g., transmit or receive) when the given RF filter is applied to a given signal. Examples of the RF filter 108 may include Bulk Acoustic Wave (BAW) filters, Surface Acoustic Wave (SAW), ceramic filters, dielectric filters, tuned microwave cavities, etc. It may be understood that, in the description hereinafter, while several examples are described with reference to the RF filter 108 being the BAW filter, other types of RF filters may also benefit from the proposed solution.

The ambient temperature around the wireless networking device 100 may fluctuate due to several external factors. Also, one or more components of the transceiver 106 may generate heat during the operation of the wireless networking device 100. For example, in wireless networking device 100, localized temperature changes may vary significantly due to changes in the ambient temperature and due to the operation of the transceiver 106. For example, electronic components such as power amplifiers in the transceiver 106 may have an extremely variable temperature profile depending on the efficiency at which they operate. While the RF filter 108 may generate minimal to no heat during its operation, the heat generated by the power amplifiers or other electronic components of the wireless networking device 100 may couple into the RF filter 108 through conduction via a shared printed circuit board (not shown) or through aggregate heat buildup in the surrounding enclosure, and air temperature inside the wireless networking device 100. If suitable control measures are not implemented, such heat coupling into the RF filter 108 may increase the temperature of the RF filter 108 thereby negatively impacting the filtering capability of the RF filter 108.

To compensate for such adverse effects of the temperature fluctuations on the performance of the RF filter 108, the wireless networking device 100, in examples consistent with the teachings of this disclosure, is designed to implement an active cooling for RF filter 108 and selective control of such active cooling. In particular, the wireless networking device 100 may include the cooling system 104 coupled to the wireless communication circuit 102 to cool the RF filter 108. The term "active cooling" or "actively cool" may refer to a heat exchange arrangement that cools a target device (e.g., the RF filter 108 in this case) using electricity. For example, such active cooling may be performed via Peltier effect coolers.

The cooling system 104 includes a cooling device 112 (e.g., a Peltier cooler), a heatsink 114, and a thermal management controller 116. Although, in FIG. 1, the heatsink 114 is shown to have a specific shape with a plurality of fins, the heatsink 114 may be any device or a structural element, for example, an antenna plate, shield, enclosure, etc., that has a temperature less than that of the RF filter 108 and sufficient thermal mass to act as a sink or reservoir for thermal energy. The cooling device 112 is placed in thermal contact with both the RF filter 108 and the heatsink 114. The term "thermal contact" or "thermal coupling" as used herein may refer to a direct or indirect connection between two components such that heat may be conducted from one component to another component. The thermal management controller 116 is also coupled to the cooling device 112 and the transceiver 106 to control the operation of the cooling device 112 based on data communication activity carried via the transceiver 106. During operation, the active cooling of the RF filter 108 via the cooling device 112 may provide temperature stability to the RF filter 108. Accordingly, the RF filter 108 may not have to be compromised on design specification to build in margin for a wider operating temperature range, thereby allowing the wireless networking device 100 to run at peak performance.

The cooling device 112 may be a heat transfer device that consumes electricity and in turn, cools the RF filter 108. In an example implementation, the cooling device 112 may be implemented as a Peltier cooler. Without limiting the scope of the present disclosure, other types of active cooling devices may also be implemented in the wireless networking device 100. For illustration hereinafter, FIG. 1 is described to have a Peltier cooler implemented as the cooling device 112. In such an implementation, the cooling device 112 includes a cool-side plate 113 and a hot-side plate 115. In the example implementation of FIG. 1, the cooling device 112 is sandwiched between the RF filter 108 and the heatsink 114 such that the cool-side plate 113 is positioned in thermal contact with the RF filter 108 and the hot-side plate 115 is positioned in thermal contact with the heatsink 114. During operation, when electrical energy (e.g., a voltage) is applied to the cooling device 112, a temperature difference is created between the cool-side plate 113 and the hot-side plate 115 such that the cool-side plate 113 remains colder than the hot-side plate 115, thereby cooling the RF filter 108. The heatsink 114 absorbs the heat from the hot-side plate 115 and conducts the heat away from the RF filter 108 via its fins.

As it is understood, cooling devices such as the Peltier coolers generate heat (e.g., by way of increasing the temperature of the hot-side plate 115) increasing the chances of such heat coupling into the RF filter 108. Therefore, in accordance with the examples presented herein, the thermal management controller 116 may be configured to control the operation of the cooling device 112 such that an amount of the excess heat produced by the cooling device 112 (e.g., by way of the Peltier cooler heating its hot-side plate 115) may be controlled resulting in reduced heat generated inside the wireless networking device 100. This in turn will reduce any heat coupled into the RF filter 108.

The temperature sensor 110 may be disposed in the vicinity of the RF filter 108. In particular, the temperature sensor 110 measures temperature in the vicinity of the RF sensor 110. In one example, the temperature measurement may be in the form of an electrical parameter measurement such as a voltage or current proportional to the temperature. In another example, the temperature measurement may be in the form of a code corresponding to the magnitude of the temperature. In some examples, the thermal management controller 116 may monitor such temperature measurements to control the operation of the cooling device 112.

The thermal management controller 116 may include at least one processing resource, for example, a processing resource 118 and a machine-readable storage medium 120 comprising (e.g., encoded with) instructions 122 that are executable by the processing resource 118 to implement various functionalities of the thermal management controller 116. The machine-readable storage medium 120 may be non-transitory and is alternatively referred to as a non-transitory machine-readable storage medium that does not encompass transitory propagating signals. The machine-readable storage medium 120 may be any electronic, magnetic, optical, or any other type of storage device that may store data and/or executable instructions. Examples of the machine-readable storage medium 120 may include Random Access Memory (RAM), non-volatile RAM (NVRAM), an Electrically Erasable Programmable Read-Only Memory (EEPROM), a storage drive (e.g., a solid-state drive (SSD) or a hard disk drive (HDD)), a flash memory, optical memory, and the like. The machine-readable storage medium 120 may be encoded with instructions 122 to control the operation of the cooling device 112. Although not shown, in some examples, the machine-readable storage medium 120 may be encoded with certain additional executable instructions to perform any other operations performed by the wireless networking device 100 or the thermal management controller 116, without limiting the scope of the present disclosure.

The processing resource 118 may be a physical device, for example, a central processing unit (CPU), a microprocessor, a graphics processing unit (GPU), a field-programmable gate array (FPGA), application-specific integrated circuit (ASIC), other hardware devices capable of retrieving and executing instructions stored in the machine-readable storage medium 120, or combinations thereof. The processing resource 118 may fetch, decode, and execute the instructions 122 stored in the machine-readable storage medium 120 to control the operation of the cooling device 112. As an alternative or in addition to executing the instructions 122, the processing resource 118 may include at least one integrated circuit (IC), control logic, electronic circuits, or combinations thereof that include several electronic components for performing the functionalities intended to be performed by the thermal management controller 116. In accordance with some examples, the thermal management controller 116 may implement, by way of the processing resource 118 executing the instructions 122, a method for controlling the operation of the cooling device 112. In some examples, the processing resource 118 may execute one or more of the instructions 122 to perform the method steps described in conjunction with FIGS. 2 and 3.

In some examples, the thermal management controller 116, by way of the processing resource 118 executing the instructions 122, may selectively operate the cooling device 112 for the durations when the transceiver 106 is performing data communication. To enable this, the thermal management controller 116 is configured to receive a signal indicating whether the transceiver 106 is performing data communication. Based on the signal, the thermal management controller 116 determines whether the transceiver 106 is performing the data communication activity. Accordingly, the thermal management controller 116 operates the cooling device 112 to actively cool the RF filter 108 during the period when the transceiver 106 is performing the data communication activity. On the other hand, in response to determining that the wireless networking device 100 is powered on and the transceiver 106 is not performing the data communication activity, the thermal management controller 116 may operate the cooling device 112 to stop actively cooling the RF filter 108.

As will be appreciated, such a selective operation of the cooling device 112 reduces the energy needed to operate the cooling device 112. Also, the proposed selective control of the cooling device 112 may reduce the amount of heat generated inside the wireless networking device 100.

In the description hereinafter, several of the operations performed by a thermal management controller, for example, the thermal management controller 116, are described with the help of flowcharts shown in FIGS. 2 and 3. In some examples, the operations described in these flowcharts may be performed by a processing resource (e.g., the processing resource 118) by executing instructions (e.g., the instructions 122) stored in the machine-readable storage medium (e.g., machine-readable storage medium 120). As an alternative or in addition to retrieving and executing instructions, the operations described in these flowcharts may be performed by implementing one or more electronic circuits that include electronic components such as an FPGA, ASIC, or other electronic circuits.

Figure 2:
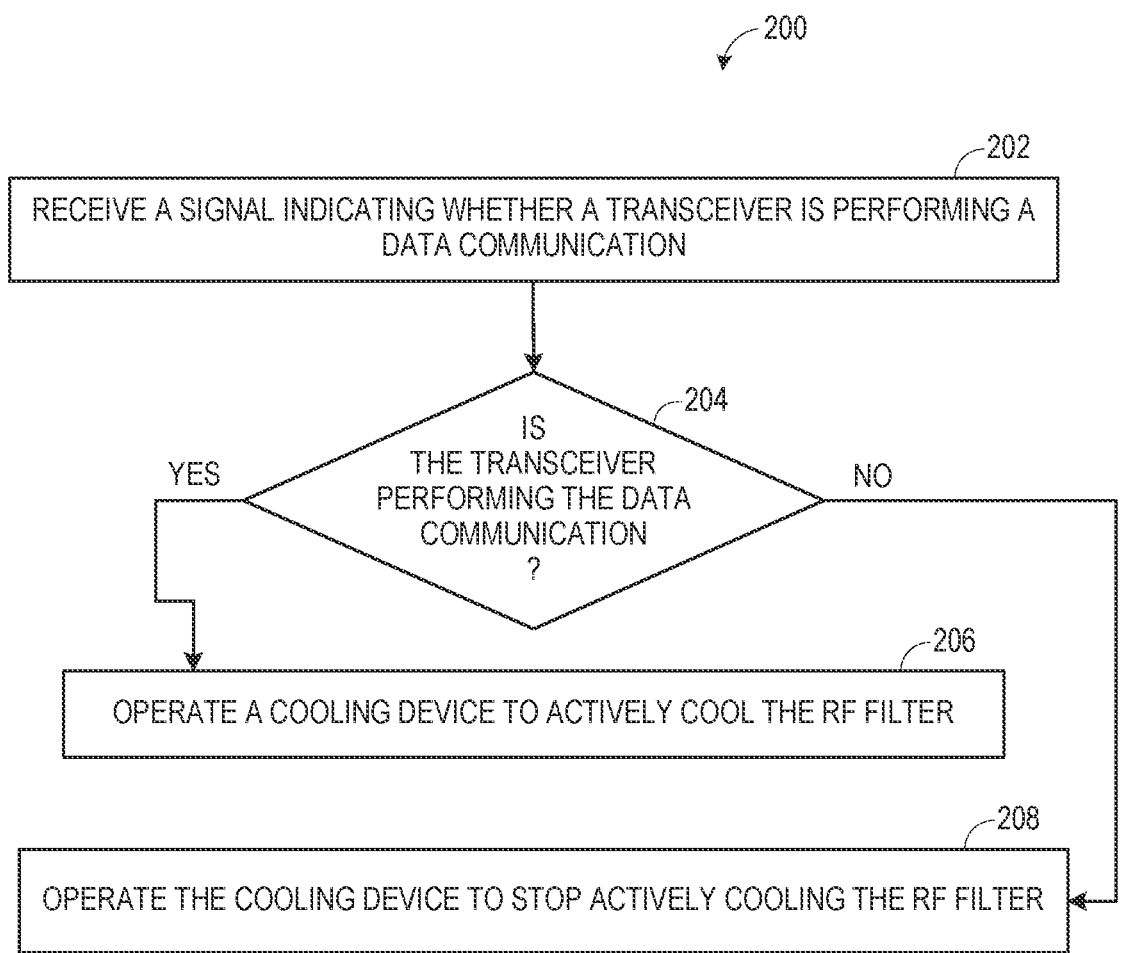
FIG. 2 depicts a flowchart of an example method for operating a cooling device in a wireless networking device.

Referring now to FIG. 2, a flowchart of an example method 200 for controlling the operation of a cooling device, for example, the cooling device 112 of FIG. 1, is depicted. In particular, the method 200 represents an example technique of controlling the active cooling of the RF filter (e.g., the RF filter 108) based on the data communication activity via a transceiver (e.g., the transceiver 106) such that the amount of heat coupled into the RF filter is minimized and the performance of the RF filter is not impacted.

At step 202, the thermal management controller (e.g., the thermal management controller 116) receives a signal indicating whether the transceiver is performing data communication. The data communication may include wireless data transmission or wireless data reception. More particularly, in one example, the data communication may include wireless data transmission or wireless data reception in compliance with one or more of the IEEE 802.11 Specifications. In an example, the transceiver may generate signals, such as, "Power Amplifier Enable" (PA Enable) or "Low-Noise Enable" (LNA Enable) depending on the data communication activity. In particular, a signal property (e.g., a logic state, a voltage magnitude, a current magnitude, or a power magnitude) of the "PA Enable" signal may indicate whether the power amplifier of the transceiver is enabled, and the transceiver is transmitting data. Similarly, a signal property of the "LNA Enable" signal may indicate whether the transceiver is receiving data from an external device. A logic state may be representative of any of the voltage magnitude, current magnitude, or power magnitude. For example, a voltage magnitude greater than or equal to 3 volts may be represented as a logic state "1", and a voltage magnitude smaller than 3 volts may be represented as a logic state "0". An example table-1 presented below shows the logic states of the "PA Enable" and "LNA Enable" signals and respective data communication status.

TABLE 1

Example logic states representing data communication status

| Signal | Logic State | Data communication status |
|---|---|---|
| PA Enable | 1 | The Transceiver is performing data transmission. |
| PA Enable | 0 | The Transceiver is not performing data transmission. |
| LNA Enable | 1 | The Transceiver is performing data reception. |
| LNA Enable | 0 | The Transceiver is not performing data reception. |

At step 204, the thermal management controller may perform a check to determine if the transceiver is performing the data communication. In one example, the transceiver may analyze the signals, for example, the "PA Enable" and "LNA Enable" to determine if the transceiver is performing the data communication. For instance, if any of the "PA Enable" and "LNA Enable" is identified to have a logic state "1", the thermal management controller may determine that the transceiver is performing the data communication. On the other hand, if any of the "PA Enable" and "LNA Enable" is identified to have a logic state "0", the thermal management controller may determine that the transceiver is not performing the data communication.

At step 204, if it is determined that the transceiver is performing the data communication, at step 206, the thermal management controller may operate the cooling device (e.g., Peltier cooler) to actively cool the RF filter. To actively cool the RF filter, the thermal management controller may apply a control signal of a predefined magnitude to the cooling device. For the purpose of illustration hereinafter, the control signal is described as being a voltage signal for the Peltier cooler implemented as the cooling device. As will be understood, in some other examples, the control signal may be electrical current or power depending on the type of cooling device. For example, so long as the voltage signal of the predefined magnitude is applied to the cooling device, the cooling device continues to lower the temperature of a cool-side plate and increase the temperature of the hot-side plate. The cool-side plate of the cooling device that is in thermal contact with the RF filter cools down the RF filter. Further, the hot-side plate that is in thermal contact with the heatsink transfers the heat to the heatsink.

However, at step 204, if it is determined that the transceiver is not performing the data communication while the wireless networking device is powered on, at step 208, the thermal management controller may operate the cooling device (e.g., disengage the cooling device) to stop actively cooling the RF filter. To stop actively cooling the RF filter, the thermal management controller may stop applying the voltage signal to the cooling device. Accordingly, the temperature of the hot-side plate may stop rising. As will be understood, as no data communication is taking place, the transceiver may not generate any heat. The above-described controlled operation of the cooling device may not only aid in cooling the RF filter (e.g., for the duration when data communication is performed) but also minimize additional heat generation via the cooling device (e.g., for the duration when data communication is not being performed).

Figure 3:
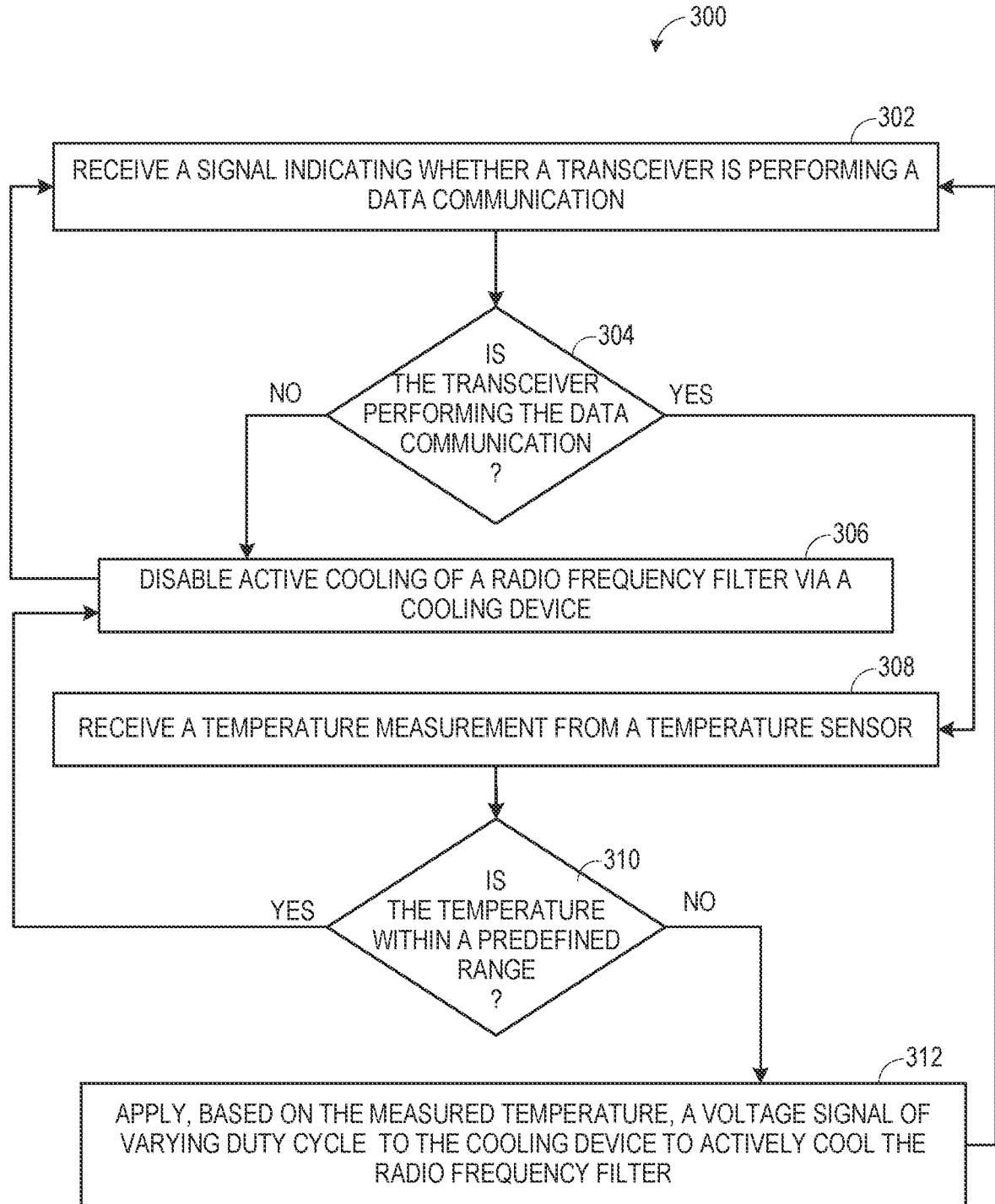
FIG. 3 depicts a flowchart of another example method for operating a cooling device in a wireless networking device.

Referring now to FIG. 3, presented is a flowchart of another example method 300 for controlling the operation of a cooling device, for example, the cooling device 112 of FIG. 1. For the sake of brevity, certain details of operations that are described in any of the previous drawings are not repeated herein. In particular, the method 300 represents an example technique of controlling the active cooling of the RF filter (e.g., the RF filter 108) based on the data communication activity and temperature measurement via a temperature sensor (e.g., the temperature sensor 110) such that the amount of heat coupled into the RF filter is minimized and the performance of the RF filter is not impacted.

At step 302, the thermal management controller (e.g., the thermal management controller 116 of FIG. 1) receives a signal indicating whether the transceiver is performing data communication. As described in conjunction with FIG. 2, the signals may include the "PA Enable" signal or the "LNA Enable" signal indicating whether the transceiver is performing data transmission or data reception, respectively. Further, at step 304, the thermal management controller may perform a check to determine if the transceiver is performing the data communication based on the analysis of the "PA Enable" and "LNA Enable" signals, for example. Details of determining whether the data communication is performed are described in conjunction with FIG. 2. At step 304, if it is determined that the transceiver is not performing the data communication while the wireless networking device is powered on, the thermal management controller, at step 306, may operate the cooling device to stop actively cooling the RF filter. To stop actively cooling the RF filter, the thermal management controller may stop applying the voltage signal to the cooling device thereby stopping the transference of heat to the RF filter through the cooling device. Post the execution of step 306, the thermal management controller may continue to monitor the signal indicating whether the transceiver is performing data communication at step 302.

Returning now to step 304, if it is determined that the transceiver is performing the data communication, the thermal management controller, at step 308, may receive a temperature measurement from a temperature sensor (e.g., the temperature sensor 110, see FIG. 1) disposed in the vicinity of the RF filter. In one example, the temperature measurement may be in the form of an electrical parameter measurement such as a voltage or current proportional to the temperature in the vicinity of the temperature sensor. In another example, the temperature measurement may be in the form of a code corresponding to the magnitude of the temperature in the vicinity of the temperature sensor. The thermal management controller may then determine the temperature in the vicinity of the RF filter based on a mapping or a correlation between the electrical parameter measurement or the code and temperature values.

At step 310, the thermal management controller may perform another check to determine if the temperature measurement is within a predefined range. The predefined range may be a range of temperature values that are acceptable for the satisfactory performance of the RF filter. In one example, the predefined range may be customized by an administrator. At step 310, if it is determined that the temperature measurement is within the predefined range, the thermal management controller, at step 306, may operate the cooling device to stop actively cooling the RF filter. Post the execution of step 306, the thermal management controller may continue to monitor the signal indicating whether the transceiver is performing data communication at step 302.

However, at step 310, if it is determined that the temperature measurement is outside the predefined range, the thermal management controller, at step 312, may operate the cooling device (e.g., Peltier cooler) to actively cool the RF filter such that temperature is maintained within the predefined range. To actively cool the RF filter, the thermal management controller may apply a voltage signal of a predefined magnitude and varying duty cycles to the cooling device. In particular, the application of the voltage signal of varying duty cycles may cause the cooling device to be temporarily activated and deactivated during a period when the transceiver is performing the data communication to maintain the temperature in the predefined range. In an example implementation, the thermal management controller may dynamically adjust the duty cycle of the voltage signal based on the temperature measurement. For example, the thermal management controller may increase the duty cycle of the voltage signal with an increase in the temperature and decrease the duty cycle of the voltage signal with a decrease in the temperature, thereby keeping the temperature in the predefined range. So long as the voltage signal of the predefined magnitude is applied to the cooling device, the cooling device continues to maintain the temperature differential between its cool-side plate and the hot-side plate. The cooler cool-side plate of the cooling device that is in thermal contact with the RF filter cools down the RF filter. Further, the hot-side plate that is in thermal contact with the heatsink transfers the heat to the heatsink. After the execution of step 312, the thermal management controller may continue to monitor, at step 302, the signal indicative of whether the transceiver is performing the data communication.

Figure 4:
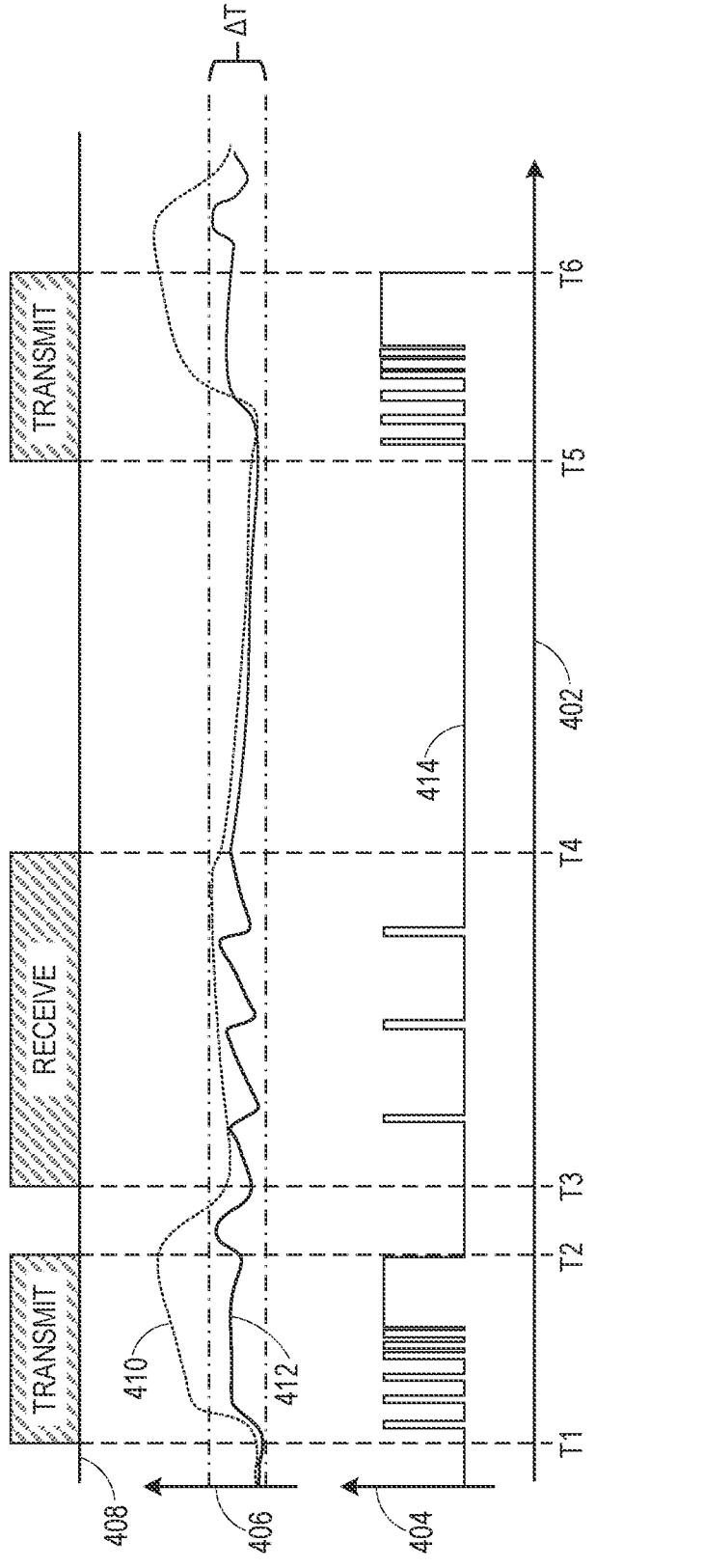
FIG. 4 depicts a graphical representation showing an example temperature profile of an RF filter corresponding to an applied voltage to a cooling device.

Turning now to FIG. 4, presented is a graphical representation 400 depicting an example temperature profile of an RF filter (e.g., the RF filter 108 implemented in the wireless networking device 100 of FIG. 1) corresponding to an applied voltage to a cooling device (e.g., the cooling device 112 implemented in the wireless networking device 100 of FIG. 1). In the graphical representation 400, an X-axis 402 represents time and Y-axis 404 and 406 respectively represent a voltage magnitude and a temperature magnitude. Further, an operation axis 408 specifies an operation (e.g., data transmission or data reception) being performed via the transceiver of the wireless networking device for a given duration. In the graphical representation 400, a curve 410 depicted using a dotted line represents temperature measurements in the vicinity of the RF filter when no active cooling of the RF filter is performed.

Furthermore, a curve 412 depicted using a solid line represents temperature measurements in the vicinity of the RF filter when a controlled active cooling of the RF filter is implemented, in accordance with one or more examples presented herein. Moreover, a curve 414 represents a voltage signal of varying duty cycles applied to a cooling device (e.g., Peltier cooler). A thermal management controller (e.g., the thermal management controller 116 implemented in the wireless networking device 100 of FIG. 1) of a cooling system (e.g., the cooling system 104) controls the operation of the cooling device to maintain the temperature measurement 412 within a predefined range ΔT by way of controlling the voltage signal 414 applied to the cooling device. As observed from graphical representation 400, when no active cooling is implemented for the RF filter, the temperature measurements (plotted as the curve 410) in the vicinity of the RF filter may exceed the predefined range ΔT.

As depicted in FIG. 4, during the periods T1-T2, T3-T4, and T5-T6, the transceiver performs data communication (e.g., data transmission or reception). Whereas, in periods T2-T3 and T4-T5, no data communication is performed. Accordingly, as depicted in FIG. 4, during the periods T1-T2, T3-T4, and T5-T6, the thermal management controller applies the voltage signal 414 of the predefined magnitude to the cooling device to actively cool the RF filter. In some examples, as depicted, the duty cycle of the voltage signal 414 is also varied to increase or decrease the amount of cooling via the cooling device. Accordingly, it is observed that the temperature measurement 412 is maintained within a predefined range ΔT.

Figure 5:
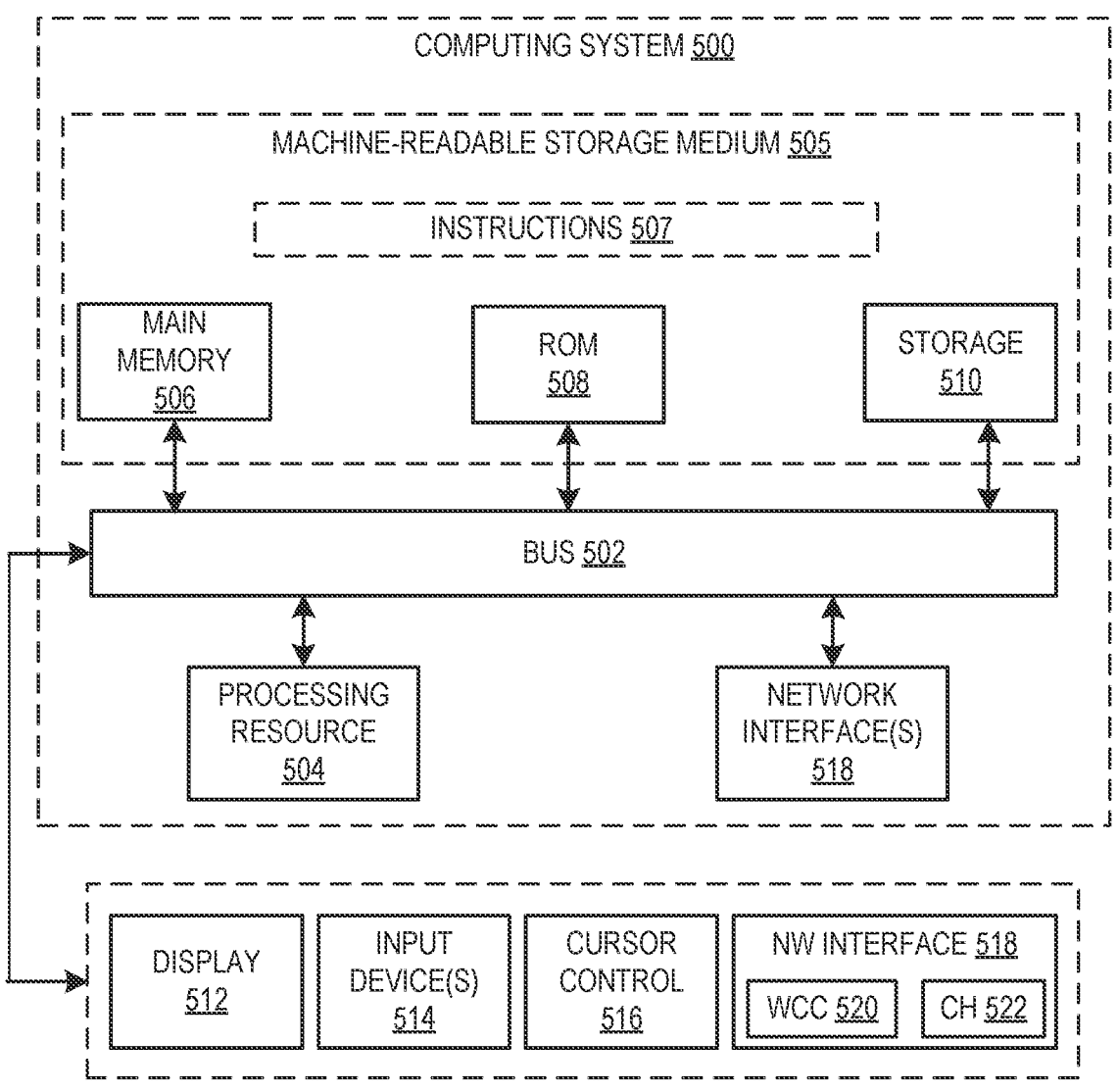
FIG. 5 depicts a block diagram of an example computing system.

FIG. 5 depicts a block diagram of an example computing system 500 in which various of the examples described herein may be implemented. In some examples, the computing system 500 may be configured to operate as a wireless networking device, such as the wireless networking device 100 of FIG. 1, and can perform various operations described in conjunction with one or more of the earlier drawings. In some other examples, the computing system 500 may be configured to operate as a wireless networking device, such as the wireless networking device 100 of FIG. 1, and can perform various operations described in one or more of the earlier drawings. Examples of the devices and/or systems that may be implemented as the computing system 500 may include, desktop computers, laptop computers, servers, web servers, authentication servers, AAA servers, DNS servers, DHCP servers, IP servers, VPN servers, network policy servers, mainframes, tablet computers, e-readers, netbook computers, televisions and similar monitors (e.g., smart TVs), content receivers, set-top boxes, PDAs, mobile phones, smartphones, smart terminals, dumb terminals, virtual terminals, video game consoles, virtual assistants, IoT devices, and the like.

The computing system 500 may include a bus 502 or other communication mechanisms for communicating information, a hardware processor, also referred to as processing resource 504, and a machine-readable storage medium 505 coupled to the bus 502 for processing information. In some examples, the processing resource 504 may include one or more CPUs, semiconductor-based microprocessors, and/or other hardware devices suitable for retrieval and execution of instructions stored in the machine-readable storage medium 505. The processing resource 504 may fetch, decode, and execute instructions to control the operation of a cooling device (e.g., a Peltier cooler). As an alternative or in addition to retrieving and executing instructions, the processing resource 504 may include one or more electronic circuits that include electronic components for performing the functionality of one or more instructions, such as an FPGA, an ASIC, or other electronic circuits. In an example implementation, the processing resource 504 and the machine-readable storage medium 505 may together function as a thermal management controller such as the thermal management controller 116 described in conjunction with FIG. 1.

In some examples, the machine-readable storage medium 505 may include a main memory 506, such as a RAM, cache and/or other dynamic storage devices, coupled to the bus 502 for storing information and instructions to be executed by the processing resource 504. The main memory 506 may also be used for storing temporary variables or other intermediate information during the execution of instructions to be executed by the processing resource 504. Such instructions, when stored in storage media accessible to the processing resource 504, render the computing system 500 into a special-purpose machine that is customized to perform the operations specified in the instructions. The machine-readable storage medium 505 may further include a read-only memory (ROM) 508 or other static storage device coupled to the bus 502 for storing static information and instructions for the processing resource 504. Further, in the machine-readable storage medium 505, a storage device 510, such as a magnetic disk, optical disk, or Universal Serial Bus (USB) thumb drive (Flash drive), etc., may be provided and coupled to the bus 502 for storing information and instructions.

In some examples, the computing system 500 may be coupled, via the bus 502, to a display 512, such as a liquid crystal display (LCD) (or touch-sensitive screen), for displaying information to a computer user. In some examples, an input device 514, including alphanumeric and other keys (physical or software generated and displayed on a touch-sensitive screen), may be coupled to the bus 502 for communicating information and command selections to the processing resource 504. Also, in some examples, another type of user input device such as a cursor control 516 may be connected to the bus 502. The cursor control 516 may be a mouse, a trackball, or cursor direction keys. The cursor control 516 may communicate direction information and command selections to the processing resource 504 for controlling cursor movement on the display 512. In some other examples, the same direction information and command selections as cursor control may be implemented via receiving touches on a touch screen without a cursor.

In some examples, the computing system 500 may include a user interface module to implement a Graphical User Interface (GUI) that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

The computing system 500 also includes a network interface 518 coupled to bus 502. The network interface (labeled as "NW interface" in FIG. 5) 518 provides a two-way data communication coupling to one or more network links that are connected to one or more local networks. For example, the network interface 518 may be an integrated services digital network (ISDN) card, cable modem, satellite modem, or a modem to provide a data communication connection to a corresponding type of telephone line. As another example, the network interface 518 may be a local area network (LAN) card or a wireless communication unit (e.g., a Wi-Fi chip/module). In some examples, the network interface 518 may include a wireless communication circuit 520 (labeled as "WCC" in FIG. 5) which is an example representative of the wireless communication circuit 102. Also, the network interface 518 may include cooling hardware 522 (labeled as "CH" in FIG. 5) that may include a cooling device and a heatsink (not shown) that are example representatives of the cooling device 112 and the heatsink 114 described in FIG. 1.

In some examples, the machine-readable storage medium 505 (e.g., one or more of the main memory 506, the ROM 508, or the storage device 510) stores instructions 507 which when executed by the processing resource 504 may cause the processing resource 504 to execute one or more of the methods/operations described hereinabove. The instructions 507 may be stored on any of the main memory 506, the ROM 508, or the storage device 510. In some examples, the instructions 507 may be distributed across one or more of the main memory 506, the ROM 508, or the storage device 510. In some examples, the instructions 507 may include instructions that when executed by the processing resource 504 may cause the processing resource 504 to perform one or more of the methods described in FIGS. 2 and 3.

Terms and phrases used in this document, and variations thereof, unless otherwise expressly stated, should be construed as open-ended as opposed to limiting. As examples of the foregoing, the term "including" should be read as meaning "including, without limitation" or the like. The term "example" is used to provide exemplary instances of the item in the discussion, not an exhaustive or limiting list thereof. The terms "a" or "an" should be read as meaning "at least one," "one or more" or the like. The presence of broadening words and phrases such as "one or more," "at least," "but not limited to" or other like phrases in some instances shall not be read to mean that the narrower case is intended or required in instances where such broadening phrases may be absent. Further, the term "and/or" as used herein refers to and encompasses any and all possible combinations of the associated listed items. It will also be understood that, although the terms first, second, third, etc., may be used herein to describe various elements, these elements should not be limited by these terms, as these terms are only used to distinguish one element from another unless stated otherwise or the context indicates otherwise.

What is claimed is:

1. A cooling system for a wireless networking device, comprising:
   a Peltier cooler disposed in thermal contact with a radio-frequency (RF) filter coupled to a transceiver, wherein the RF filter and the transceiver are disposed in the wireless networking device;
   a thermal management controller coupled to the Peltier cooler and the transceiver, wherein the thermal management controller is configured to:
   receive a signal indicating whether the transceiver is performing a data communication;
   in response to the signal indicating the transceiver is performing the data communication, operate the Peltier cooler to actively cool the RF filter; and
   in response to the signal indicating the transceiver is not performing the data communication while the wireless networking device is powered on, operate the Peltier cooler to stop actively cooling the RF filter.

2. The cooling system of claim 1, wherein the RF Filter is a Bulk Acoustic Wave (BAW) filter, a Surface Acoustic Wave (SAW) filter, a ceramic filter, a dielectric filter, or a tuned microwave cavity.

3. The cooling system of claim 1, wherein the data communication comprises a wireless data transmission, a wireless data reception, or both the wireless data transmission and the wireless data reception.

4. The cooling system of claim 1, further comprising a heatsink disposed in thermal contact with the Peltier cooler.

5. The cooling system of claim 4, wherein the Peltier cooler comprises a cool-side plate and a hot-side plate, wherein the Peltier cooler is sandwiched between the RF filter and the heatsink such that the cool-side plate is disposed in thermal contact with the RF filter and the hot-side plate is disposed in thermal contact with the heatsink.

6. The cooling system of claim 1, further comprising a temperature sensor disposed adjacent to the RF filter to measure a temperature in the vicinity of the RF filter, wherein the thermal management controller is configured to operate the Peltier cooler such that temperature is maintained within a predefined range.

7. The cooling system of claim 1, wherein the wireless networking device is an access point.

8. A method comprising:
   receiving, by a thermal management controller from a transceiver disposed in a wireless networking device, a signal indicating whether the transceiver is performing a data communication, wherein the wireless networking device further comprises a cooling device disposed in thermal contact with a radio-frequency (RF) filter coupled to the transceiver;

in response to the signal indicating the transceiver is performing the data communication, operating, by the thermal management controller, the cooling device to actively cool the RF filter; and in response to the signal indicating the transceiver is not performing the data communication while the wireless networking device is powered on, operating, by the thermal management controller, the cooling device to stop actively cooling the RF filter.

9. The method of claim 8, wherein the RF filter comprises a Bulk Acoustic Wave (BAW) filter.

10. The method of claim 8, wherein the wireless networking device further comprises a heatsink disposed in thermal contact with the RF filter to provide passive cooling to the RF filter.

11. The method of claim 10, wherein the cooling device comprises a Peltier cooler comprising a cool-side plate and a hot-side plate, wherein the Peltier cooler is sandwiched between the RF filter and the heatsink such that the cool-side plate is disposed in thermal contact with the RF filter and the hot-side plate is disposed in thermal contact with the heatsink.

12. The method of claim 8, wherein the wireless networking device further comprises a temperature sensor disposed adjacent to the RF filter to measure a temperature in the vicinity of the RF filter.

13. The method of claim 12, further comprising operating the cooling device to actively cool the RF filter such that the temperature is maintained within a predefined range.

14. The method of claim 13, wherein operating the cooling device to actively cool the RF filter comprises, temporarily activating and deactivating the cooling device during a period when the transceiver is performing the data communication to maintain the temperature in the predefined range.

15. The method of claim 14, wherein temporarily activating and deactivating the cooling device comprises applying a voltage signal of a varied duty cycle to the cooling device based on the temperature.

16. The method of claim 15, wherein applying the voltage signal comprises increasing a duty cycle of the voltage signal with an increase in the temperature and decreasing the duty cycle of the voltage signal with a decrease in the temperature, thereby keeping the temperature in the predefined range.

17. A wireless networking device, comprising:

a wireless communication circuit comprising a transceiver and a Bulk Acoustic Wave (BAW) filter coupled to the transceiver; and a cooling system coupled to the wireless communication circuit to cool the BAW filter, wherein the cooling system comprises:

a Peltier cooler disposed in thermal contact with the BAW filter; and a thermal management controller coupled to the Peltier cooler and the transceiver, wherein the thermal management controller is configured to:

receive a signal indicating whether the transceiver is performing a data communication;

in response to the signal indicating the transceiver is performing the data communication, operate the Peltier cooler to actively cool the BAW filter; and in response to the signal indicating the transceiver is not performing the data communication while the wireless networking device is powered on, operate the Peltier cooler to stop actively cooling the BAW filter.

18. The wireless networking device of claim 17, wherein the data communication comprises wireless data communication performed in accordance with one or more of the Institute of Electrical and Electronics Engineers (IEEE) 802.11 Specifications.

19. The wireless networking device of claim 17, wherein the cooling system further comprises a heatsink disposed in thermal contact with the Peltier cooler.

20. The wireless networking device of claim 17, wherein the cooling system further comprises a temperature sensor disposed adjacent to the BAW filter to measure a temperature in the vicinity of the BAW filter, wherein the thermal management controller is configured to control a duty cycle of a voltage signal applied to the Peltier cooler such that temperature is maintained within a predefined range.

* * * * *